United States Patent [19]

Biehl et al.

[11] Patent Number: 4,939,465

[45] Date of Patent: Jul. 3, 1990

[54] PROBE HEAD FOR NUCLEAR MAGNETIC RESONANCE (NMR) MEASUREMENTS, IN PARTICULAR FOR USE IN NMR TOMOGRAPHY

[75] Inventors: Reinhard Biehl, Karlsruhe; Gunther R. Laukien, Rheinstetten, both of Fed. Rep. of Germany

[73] Assignee: Bruker Medizintechnik GmbH, Rheinstetten-Forchheim, Fed. Rep. of Germany

[21] Appl. No.: 875,809

[22] Filed: Jun. 18, 1986

[30] Foreign Application Priority Data

Jun. 22, 1985 [DE] Fed. Rep. of Germany ....... 3522401

[51] Int. Cl.$^5$ ............................................ G01R 33/20
[52] U.S. Cl. .................................... 324/318; 324/300
[58] Field of Search ............... 324/300, 307, 309, 318, 324/313, 314, 319, 320, 322

[56] References Cited

U.S. PATENT DOCUMENTS

| | | | |
|---|---|---|---|
| 4,398,149 | 8/1983 | Zens | 324/300 |
| 4,439,733 | 3/1984 | Hinshaw | 324/318 |
| 4,607,225 | 8/1986 | Crooks | 324/318 |
| 4,616,181 | 10/1986 | Kemner | 324/309 |
| 4,649,348 | 3/1987 | Flugan | 324/309 |
| 4,680,550 | 7/1987 | Krause | 324/318 |

Primary Examiner—Michael J. Tokar
Attorney, Agent, or Firm—Pennie & Edmonds

[57] ABSTRACT

A probe head is provided for nuclear magnetic resonance (NMR) measurements, in particular for use in NMR tomography.

15 Claims, 3 Drawing Sheets

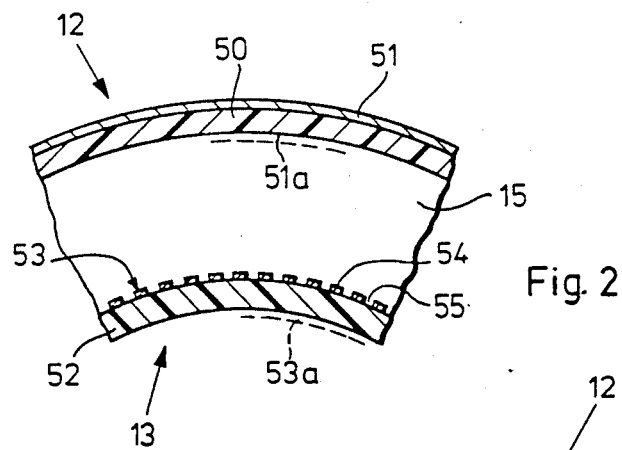
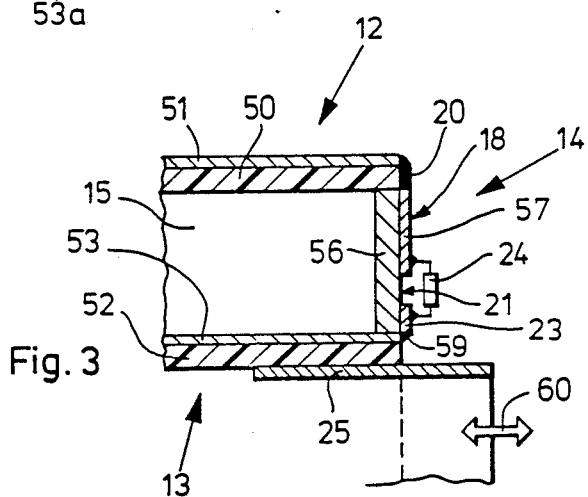
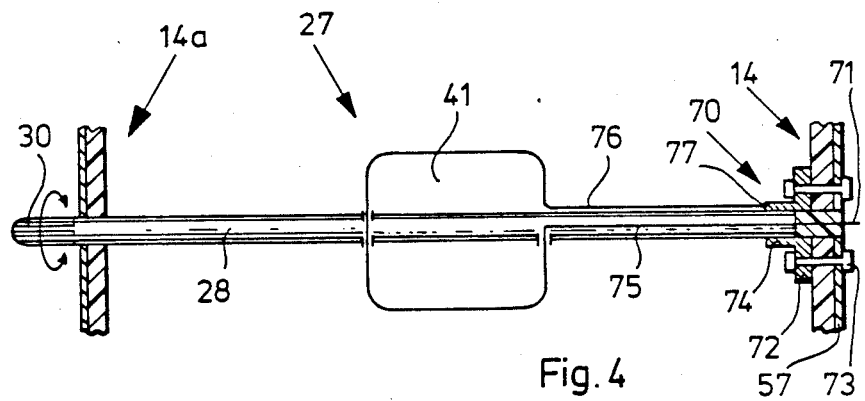

PROBE HEAD FOR NUCLEAR MAGNETIC RESONANCE (NMR) MEASUREMENTS, IN PARTICULAR FOR USE IN NMR TOMOGRAPHY

The present invention relates to a probe head for nuclear magnetic resonance (NMR) measurements, in particular for use in NMR tomography, comprising a hollow cylindrical housing whose outer cylindrical wall consists of a substantially continuous electrically conductive material, whose inner cylindrical wall surrounding the test cavity is provided with a plurality of parallel and axially extending electric conductors and whose end faces arranged between the outer wall and the inner wall are permeable to alternating current and conductively connected with the outer wall, a coupling arrangement being provided for generating electric radio-frequency currents in said conductors.

A probe head of this type has been known already from European Patent Application No. 0 084 946.

In the case of the known probe head, the outer cylindrical wall is made from sheet steel and connected continuously with the end faces which are likewise made from sheet steel. The inner cylindrical wall is formed by a plastic tube provided at each of its ends neighboring the said end faces with a rotating and electrically conductive strip which is fixed in space. Located in the space between the outer and the inner walls, which are thus enclosed all around, is a toroidal, short-circuited coil. The coil is wound from a coaxial line, whose outer jacket is stripped off in the areas of the innermost windings over a length corresponding to the spacing between the conductive strips arranged on the plastic tube. Fixed to one of these insulated inner conductors is a coupling arrangement in the form of a coaxial line disposed in parallel and leading by its one end to a plug in one of the end faces, while the associated inner conductor is connected by its opposite end with the opposite end face.

The known probe head is intended to ensure that the components of the electric and/or magnetic field of the shortcircuited toroidal coil are perfectly shielded, with the exception of the area of the exposed inner conductor. It is only in the area of this exposed inner conductor that a radio-frequency magnetic field of high homogeneity and directed transversely to the longitudinal axis of the probe head over the whole test cavity is to be generated, through the plastic tube, within the test cavity defined by the inner cylindrical wall.

It is, however, a disadvantage of the known probe head that its structure is very complicated and that, above all, considerable adjusting problems are encountered because the individual mutually spaced windings of the toroidal coil must be positioned with extreme accuracy which in practice should lead to considerable problems because the individual windings are soldered to the electrically conductive strips and/or the enclosing end faces and the outer cylindrical wall only by their outer jackets. These practical difficulties also restrict the number of possible windings to, for example, 24 which also restricts the degree of homogeneity of the radio-frequency field that can be achieved.

In the known probe head, the shielding taking the form of an outer cylindrical, electrically conductive wall and two adjoining end shields substantially serves to shield the radio-frequency field emanating from the toroidal coil. The influence of the shielding on the function, in particular the field distribution of the radio-frequency field within the coil, is at best of a subordinate nature. For, in order to operate the probe head in the desired manner one has not only to position the exposed inner conductors precisely, but also to select the position and/or the length of the return loops connecting these exposed inner conductors exactly in such a manner that the amplitude and phase distribution of the currents on the exposed inner conductors is in strict compliance with a pre-determined pattern. Regarded under electrical aspects, this known probe head therefore has the function of a shielded coil comprising several discrete individual windings whose function and field distribution is exclusively determined by the sizing and position of the individual windings.

A probe head similar to that described above has been known also from European Patent Application Number 0 047 065.

From European Patent Application Number 0 141 383, numerous other probe heads have been known where axially extending conductors surround a test space enclosing a specimen which is to be subjected to NMR tomography measurements. However, all these known probeheads have in common that the axial conductors end in an electrically conductive end ring to which they are either directly connected or coupled capacitively. However, these arrangements all lack an outer cylindrical wall or any other return means for the radio-frequency current.

Finally, there has been known from German Patent Application Number 31 33 432 a radio-frequency magnetic field device in a nuclear spin resonance apparatus in which a symmetrical four-wire line is supplied in pairs with oppositely phased high-frequency current from one end face. The opposite ends of the four conductors are connected by means of capacitors to a ring which extends around the end face and from which band-shaped longitudinal bars lead to a corresponding ring arranged at the opposite end of the arrangement from which the four-wire line is supplied with oppositely phased current in the before-described manner.

Regarded under electrical aspects, this known probe head, therefore, also has the function of an electric coil with four discrete windings so that it is of decisive importance for the exact function of this probe head that the four conductors are positioned exactly and the phase relation is exactly maintained during feeding of the conductors.

Now, it is the object of the present invention to improve a probe head of the type described above in such a manner that a radio-frequency magnetic field orthogonal to the longitudinal axis and offering very high homogeneity over the whole test space is obtained with the simplest possible mechanical structure and, if possible, without the need to adjust the system.

According to the invention, this object is achieved by an arrangement in which at least about 50 conductors are distributed uniformly over the circumference of the inner wall and the free ends of the conductors are connected only with the two end faces, via capacitors.

This solves the underlying problem fully and perfectly because this arrangement provides a completely different resonance system which does not depend on the discrete distribution of individual conductor paths, their position or length relative to each other or a particular radio-frequency supply, but which rather provides a probe head of a type in which the inner cylindrical wall exhibits, in the best approximation that can be achieved practically, electric conductivity only in the axial direction. This is achieved on the one hand by the above-mentioned very great number of conductors, but on the other hand also by the fact that the conductors are in no way directly connected to one another, but are connected at the two ends exclusively to the end faces, via capacitors.

Since, therefore, the geometrical conditions are not as critical in this arrangement, no adjusting problems will be encountered as in the case of the coil windings or the four-wire line of the prior art. The function of the return line is performed according to the invention by the end faces and the entire outer cylindrical wall which can easily be given a rigid and fixed design so that no adjustments will become necessary, neither during production nor during use of the probe head.

According to a preferred embodiment of the invention, the conductors take the form of conducting paths etched into the copper lining of a tubular carrier body.

This feature also has the advantage to provide high mechanical stability; in addition, it is a particular advantage of this embodiment of the invention that the number of the axially extending conductors can be very high, for example 120 or more. This increases the homogeneity of the obtained radio-frequency field still further.

According to another embodiment of the invention, a loop antenna which can rotate about an axis parallel to the axis of the hollow cylindrical housing and whose surface extends parallel to the axis of the hollow cylindrical housing, is arranged in the space between the inner and the outer walls.

This feature provides the advantage that it is possible to feed the radio-frequency energy required for exciting the nuclear magnetic resonance in the specimen and to adjust the probe head simultaneously to the physical properties of the specimen to be measured.

According to still other embodiments of the invention, the arrangement comprises at least two coupling arrangements which are spaced by 90° about the periphery of the probe head and whose radio-frequency supply currents are shifted by 90°.

This feature provides the advantage that circularly polarized excitation can be produced in the test space which can be finely adjusted, in particular by the before-described rotation of a loop antenna about its axis. However, as is commonly known, the use of circularly polarized excitation leads in nuclear magnetic resonance to an increased signal yield and/or an improved signal-to-noise ratio because the excitation energy can be better utilized and the nuclear magnetic resonance signal is received better as well, as both processes are effected in the rotating frame.

According to a particularly preferred variant of this embodiment, the coupling arrangements are fed from a common radio-frequency current source, the supply line for the one coupling arrangement being longer, electrically, by 90° than the supply line of the other coupling arrangement.

This feature provides the advantage of a particularly simple electrical structure because probe heads of the relevant type are usually operated at a single fixed frequency so that a cable of a given length will produce a specific shift in phase.

According to still further embodiments of the invention, at least one tubular, electrically conductive section is arranged to slide in the axial direction inside the inner wall.

This feature provides the advantage that tuning is rendered particularly easy by influencing the marginal field. This applies in particular to a variant of this embodiment where two sections are provided inside the inner wall in the area of the end faces.

Still other embodiments of the invention distinguish themselves by observation openings provided in the outer wall.

This feature provides the advantage that the specimen to be measured can be observed while the measurement is carried out, which may be important in particular with living objects. In addition, an observation opening also provides advantages where the entire head of a patient is to be measured because the openings provide the patient at least with a limited view of the outside so that the patient will be less likely to develop uneasy feelings.

Finally, an embodiment of the invention is particularly preferred in which the probe head is sized and the coupling arrangements are rated in such a manner that at a given frequency of the radio-frequency supply current a standing wave of less than half a wave length is produced in the probe head so that a maximum of the magnetic radio-frequency field is encountered in the middle of the axial length of the probe head.

This feature provides the advantage that the specimen is excited with a maximum radio-frequency magnetic field so that excitation can be effected with the least possible rf power and optimum signal yield is obtained as well.

Other advantages of the invention will become apparent from the following description and the attached drawing.

It goes without saying that the features that have been described above and that will be explained further below can be used not only in the particular combination described, but also alone or in any other combination, without departing from the scope of the present invention.

Some embodiments of the invention will be described hereafter in more detail with reference to the drawing in which FIG. 1 shows a perspective representation of a probe head according to the invention, partly broken away;

FIG. 2 is a sectional view taken along line II—II in FIG. 1, in enlarged scale;

FIG. 3 is a sectional view taken along line III—III in FIG. 1, also in enlarged scale;

FIG. 4 is a sectional view illustrating a coupling arrangement according to the invention;

Figure 1:
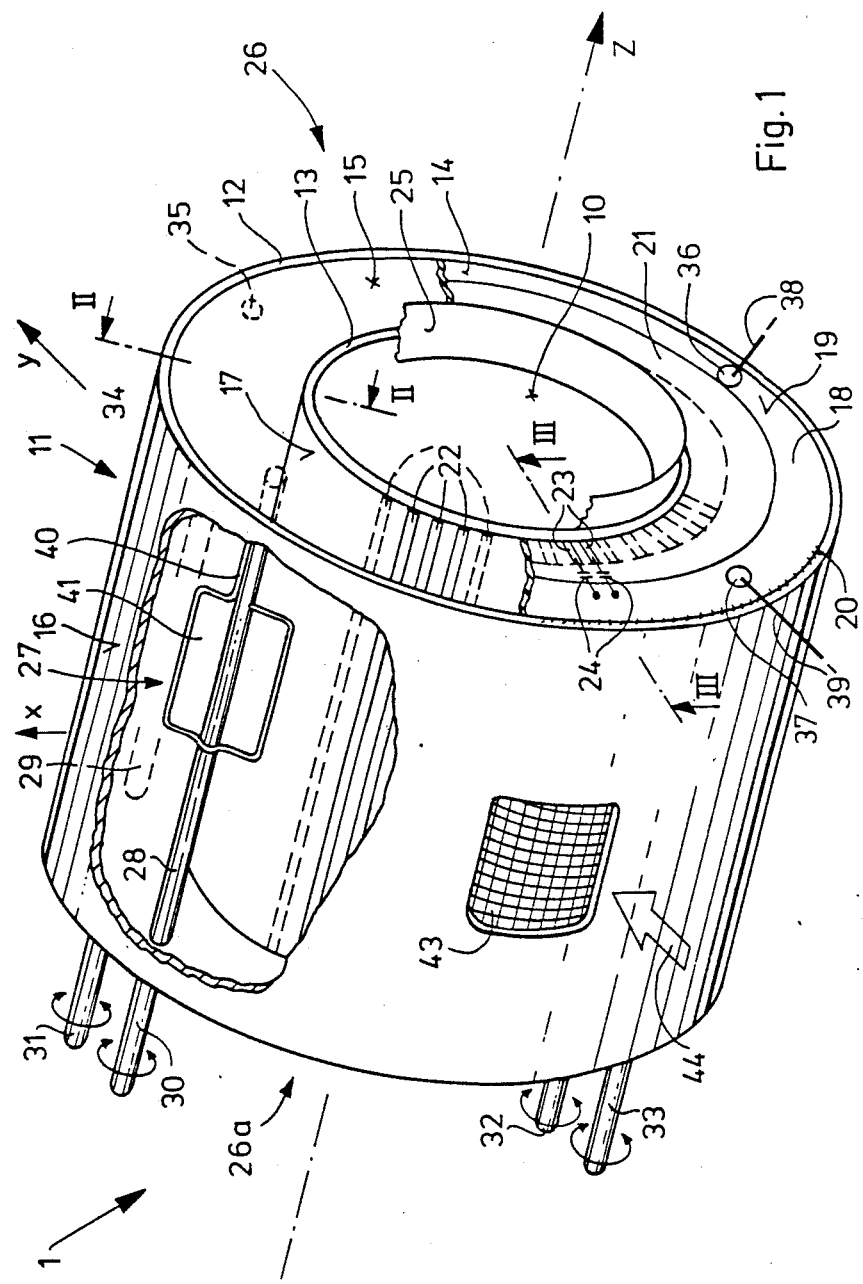

In FIG. 1, a probe head for use in NMR tomography is generally indicated at 1, the letters NMR standing for "Nuclear Magnetic Resonance". It is, however, understood that the probe head can be used also for usual NMR measurements on chemical or biological substances.

The longitudinal axis of the substantially cylindrical probe head 1 is designated by z, the axes extending orthogonally thereto by x and y. It is commonly known to arrange such probe heads 1 for use in NMR tomography in a magnetic field of high field strength and homogeneity, the direction of which coincides with the axis z of the probe head 1.

A specimen, in particular a part of a living body, such as the head or the limbs of a human being or an animal, are positioned in a test space 10 of the probe head 1 and subjected therein to a radio-frequency magnetic field extending substantially in a direction transverse to the axis z of the constant magnetic field. Probeheads 1 for use in NMR tomography serve, therefore, principally for applying upon a specimen a radio-frequency magnetic field which is directed transversely to the direction of the constant magnetic field and which is as homogenous as possible.

The probe head 1 according to FIG. 1 comprises a hollow cylindrical housing 11 having an outer wall 12 and an inner wall 13, and closed end faces 14 spanning the space 15 between the outer and inner walls 12, 13.

The surface 16 of the outer wall 12 and the surface 17 of the inner wall 13 are electrically conductive. The end faces 14 are subdivided in the radial direction. An outer arc-shaped area 18 is provided with a likewise electrically conductive surface 19 which is connected with the conductive surface 16 of the outer wall 12 via a soldered joint 20 extending about the full circumference, while an inner area 21 of the end faces 14 is non-conductive.

The conductive surface 17 of the inner wall 13 is electrically conductive only in a direction parallel to the axis z of the housing 11, being subdivided into axial conductors 22. Each of the conductors 22 is connected with a radially extending conductive strip 23 provided on the inner portion 21 of the end faces 14. Capacitors 24 lead from the strips 23 to the outer conductive area 18 of the end face 14. The number of conductors 22 depends on the dimensions of the probe head. If these dimensions are small, a smaller number of conductors will be sufficient—also for practical reasons—, for example for an inner diameter of approx. 11 mm only 10 or 20 will suffice, while in the case of larger diameters even some hundred conductors may be provided. The decisive point is that the best possible approximation to an exclusively axial conductivity is achieved in order to prevent the disadvantages of the known probe heads where distributors provided in discrete distribution have to be considered as elements of a coil.

In the area of the end face 14, a tubular, likewise electrically conductive section 25 is fitted within the inner wall 13 and arranged for being displaced in the direction of axis z.

The above description referred to only one end face 26 of the probe head 1. It goes, however, without saying that the opposite end face 26a, which is not shown in detail in FIG. 1, is designed correspondingly which means that the design of the probe head 1 is, generally, symmetrical.

To permit energy to be coupled into the probe head 1, four coupling arrangements are distributed over the circumference of the probe head. Only one of these coupling arrangements is shown in detail at 27. For adjusting the coupling arrangements 27, rods 28, 29 are provided in the space 15, parallel to the axis z. The rods 28, 29 end at their one ends in handles 30, 31, 32, 33 that can be turned in the directions indicated by double arrows. The opposite ends of the rods 28, 29 are seated in bearings 34, 35, 36, 37 in the opposite end face 14, the bearings 34, 35, 36, 37 serving at the same time as connections, as indicated at 38 and 39.

An axial line 40 leads from the connections 38, 39 to a loop antenna which is arranged substantially in the middle of the axial extension of the rods 28, 29 and which will be described in more detail further below, with reference to FIG. 4.

Finally, an observation opening 43 is arranged in the outer wall 12 which gives a view of the inside of the probe head and also of the test space 10, in the direction indicated by arrow 44.

FIG. 2 shows the details of the inner and outer walls 12, 13.

As is readily seen, the wall 12 consists of a carrier body 50 and a copper lining 51. The carrier body 50 may be made from glass, a ceramic or plastic material. It has been found that a fiber-reinforced plastic material having a dielectric coefficient $\epsilon$ of 3.8 and a loss factor tan $\delta$ of 0.15 at 50 Hz is particularly well suited.

The copper lining 51 may of course be replaced by any other conductive surface, such as a vapor-deposited metal layer, a conductive lacquer or the like. Further, the copper lining 51 or the other conductive surface may also be provided on the inside of the carrier body 50, as indicated at 51a.

The inner wall 13 consists likewise of a carrier body 52 and a copper lining 53, which may also be provided on the inside, as indicated at 53a. Conductor paths 54 with spaces 55 arranged therebetween are provided in the copper lining 53 by etching or any other known method.

The material used for the carrier body 52 of the inner wall 13 may also be glass, a ceramic or plastic material; it has been found that a polyvinyl chloride (PVC) having a dielectric coefficient $\epsilon$ of 3.5 and a loss factor tan $\delta$ of 0.03 at 1 MHz is particularly well suited.

The representation of FIG. 3 illustrates in detail the conditions existing in the area of the end faces 14.

It can be seen that the end faces 14 also consist of a carrier body 56 and a copper lining 57 in the outer area 18. The pattern formed by the outer area 18, the inner area 21 and the strips 23 can be produced by etching the copper lining 57, or in a similar manner.

One also recognizes in FIG. 3 clearly the all-round soldering joint 20 connecting the outer area 18 with the copper lining 51, and a soldering joint 59 connecting the strips 23 to the copper lining 53 of the inner wall 13.

Again, the material used for the carrier body 56 may be glass, a ceramic or plastic material; the polyvinyl chloride mentioned already in connection with the carrier body 52 has proved to be particularly well suited.

In a practical example of the probe head 10 according to the invention, the copper lining 51 of the outer wall 12 consisted of a copper sheet of 0.3 mm thickness which was wound upon the outside of the carrier body 50 and soldered together along a surface line. The copper lining 53 of the inner wall 13 was made in a practical example from a flexible circuit board material the conductive surface of which consisted of a copper coating of 35 $\mu$m thickness.

The probe head built up in this manner had a length of 250 mm, an outer diameter of approx. 250 mm and an inner diameter of approx. 160 mm. 120 equidistant conductors 22 were applied upon the inner wall 13 and connected by their two ends to the end faces, via capacitors of 2.7 pF each. The probe head was designed for a measuring frequency of 100 MHz.

Tuning of the probe head 10 according to FIGS. 1 to 3 is effected on the one hand by means of the tubular section 25 that can be displaced axially in the direction indicated by arrow 60 in FIG. 3 and which forms on each end face an adjustable capacitance of approx. 100 pF, the carrier body serving as a dielectric. The copper lining 53 performs in this case the function of the counter-electrode. Further tuning in the coupled condition is effected by means of the loop antenna 41 which has been mentioned before in connection with FIG. 1 and which is shown in detail in FIG. 4.

It can be seen that a coaxial socket 70 is provided in the end face 14 whose inner conductor 71 projects to the outside. The case 72 of the coaxial socket 70 which is connected to earth is conductively connected with the copper lining 57 by means of screws 73. A cylindrical bushing 74 of the coaxial socket 70 holds the rod 28 in a manner to permit the rod to be rotated by the handle 30 in the directions indicated by the double arrow.

An inner conductor 25 connected with the outer conductor 71 leads axially through the rod 28 and is bent off to form the loop antenna 41 substantially in the middle of the axial length of the rod 28. An outer conductor 76 leads from the loop antenna 41 to a soldered joint 77 at the bushing 74 which is connected to earth.

Figure 5:
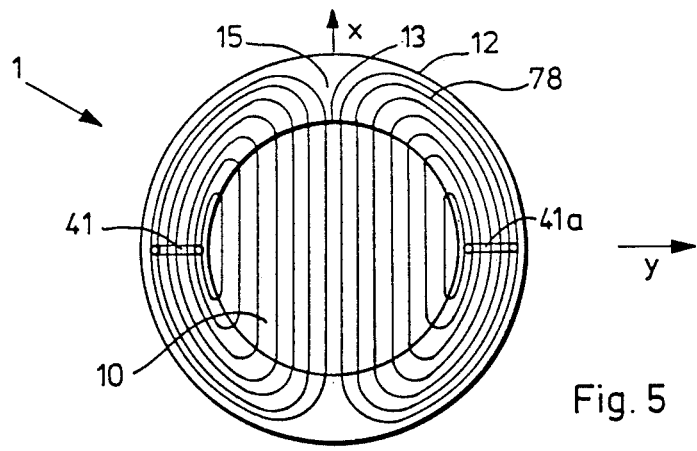
FIG. 5 is a diagrammatic representation of the distribution of the magnetic field obtained in the probe head according to the invention.

As is clearly shown by the radial section of FIG. 5 through the probe head 1, the coupling obtained when the loop antenna 41 occupies a position in which its surface is radially directed is such that the resulting field distribution of the magnetic field 78 of a TEM dipole wave extends in the test space 10 extremely perpendicularly to the longitudinal axis and is, in addition, very homogenous. The lines of the magnetic field 78 close in the space 15, extending substantally in the circumferential direction. So, the loop antenna 41 is passed by them practically perpendicularly, it being possible to balance out minor interference by turning the loop antenna 41 appropriately. A particularly effective way of exciting the magnetic field according to FIG. 5 is obtained when two antennas 41, 41a are provided in an arrangement offset by 180° and when these two antennas are fed with in-phase rf current.

Figure 6:
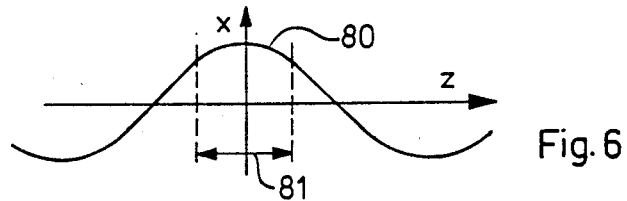
FIG. 6 is a view similar to FIG. 5, but in the axial direction.

Viewed in the axial direction, the characteristic of the amplitude of the magnetic field is as shown in FIG. 6. It can be seen that a "field bulge" 80 occurs along the center plane of the probe head 1, the sizing, coupling and, in particular, the electric termination at the end face 14 of the probe head 1 being selected in such a manner that of the whole axial curve shown in FIG. 1 only a section 81 is covered where the magnetic field exhibits its maximum amplitude.

Figure 7:
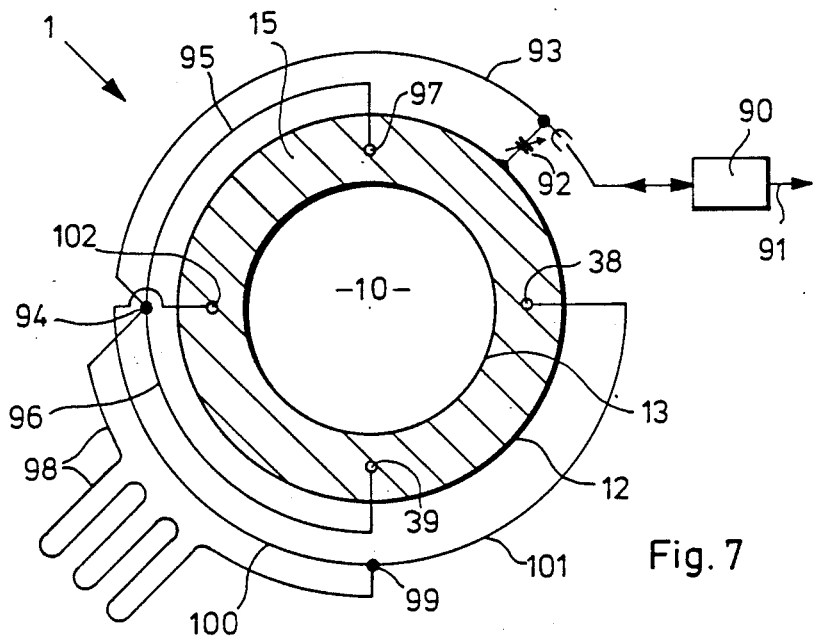
FIG. 7 is a diagrammatic representation illustrating the electric connection of coupling arrangements in a probe head according to the invention.

FIG. 7 finally shows a variant where, as indicated already in connection with FIG. 1, four coupling arrangements are distributed over a circumference in the space 15 of the probe head 1, spaced by 90° relative to each other.

A transmitter/receiver 90 serves to feed rf current into the probe head 1 and for receiving nuclear magnetic resonance signals. For further processing of these signals, the transmitter/receiver 90 is connected with a conventional tomograph as indicated by arrow 91.

The transmitter/receiver 90 feeds a coupling network consisting of a first line 93 and an adjustable capacitor 92 which permits, for example, an output impedance of 50 Ω of the probe head 1 to be adjusted so that the test head 1 is optimally adapted to a usual transmitter/receiver 90.

The first line 93 leads to a first branch point 94 from which depart a second line 95 and a third line 96 of identical length. The lines 95, 96 lead to a connection 97 and/or to the connection 39 described already in connection with FIG. 1. The connections 97 and 39 are, therefore, supplied with in-phase current, as described already in connection with the coupling arrangements 41, 41a in FIG. 5.

Further, a fourth line 98 leads away from the first branch point 94. The length of this line is such that a phase shift of exactly 90° is obtained for the operating frequency of the probe head 1. The fourth line 48 leads to a second branch point 99 from which depart, again in symmetrical arrangement, a fifth line 100 and a sixth line 101. The lines 100, 101 lead to a connection 102 and to a diametrically opposite connection 38 which has been mentioned already in connection with FIG. 1.

In this manner, the connections 97 and 39 are supplied with in-phase current, while the connections 102, 38 are also supplied in phase, but with a phase shift of 90° relative to the connections 97, 39. Consequently, two linearly polarized waves which are, however, displaced by 90° both in space and electrically, are obtained in the test space 10 which, as is generally known, results in circular polarization.

We claim:

1. A probe head for nuclear magnetic resonance (NMR) measurements, in particular for use in NMR tomography, comprising a hollow cylindrical housing having an outer cylindrical wall, an inner cylindrical wall, end faces located between said cylindrical walls and coupling means, said outer cylindrical wall comprising a substantially uniform and electrically conductive material, said inner cylindrical wall surrounding a sample area and being provided with a plurality of axially extending electric conductors having a predetermined, fixed position, said conductors being equidistantly arranged in a parallel relationship with respect to each other over the circumference of a tubular carrier body of dielectric material, said end faces comprising electrically conductive material and being electrically and rigidly connected to said outer cylindrical wall, said coupling means generating electric radio-frequency currents in said conductors, wherein each of said conductors is capacitively connected at each end to an adjacent end face, said end faces and said outer cylindrical wall forming a return conductor for said conductors.

2. Probe head according to claim 1, wherein said conductors take the form of conducting paths etched into a copper lining of the tubular carrier body.

3. Probe head according to claim 1, wherein said coupling means comprises a loop antenna which can rotate about an axis parallel to the cylindrical axis of the hollow cylindrical housing and whose surface extends parallel to the axis of said housing is arranged in a space between said walls.

4. Probe head according to claim 1, wherein the coupling means comprises at least two coupling arrangements which are spaced by 90° about the periphery of the probe head and whose radio-frequency supply currents are shifted by 90°.

5. Probe head according to claim 4, wherein said coupling arrangements are fed from a common radio-frequency current source through supply lines, the supply line for one coupling arrangement being longer, electrically, by 90° than the supply lines of the other coupling arrangement.

6. Probe head according to claim 1, wherein at least one tubular, electrically conductive section is arranged to slide in the axial direction inside said inner wall.

7. Probe head according to claim 6, wherein two sections are arranged in the inner wall in the area of said end faces.

8. Probe head according to claim 1, wherein the outer wall is provided with observation openings.

9. Probe head according to claim 1, wherein said probe head is sized and said coupling means is rated in such a manner that at a given frequency of the radio-frequency supply current a standing wave of less than half a wave length is produced in said probe head so that a maximum of the radio-frequency magnetic field is encountered in the middle of the axial length of said probe head.

10. Probe head according to claim 2, wherein said inner cylindrical wall comprises at least 120 conductors.

11. Probe head according to claim 1, wherein said end faces comprise an inner region having radially extending conductive strips and an outer conductive region, and wherein each conductor is connected to one of said strips, and a capacitor is connected between said strip and said outer region.

12. A probe head for nuclear magnetic resonance (NMR) measurements, in particular for use in NMR tomography, comprising a hollow cylindrical housing having an outer cylindrical wall, an inner cylindrical wall, end faces therebetween at axial ends of said cylindrical walls, said outer cylindrical wall comprising of a substantially uniform and electrically conductive material, said inner cylindrical wall surrounding a sample area and being provided with a plurality of axially extending electric conductors, said conductors being equidistantly arranged in a parallel relationship with respect to each other over the circumference of a tubular carrier body of dielectric material, said end faces being conductive to alternating current and conductively connected to said outer cylindrical wall, at least two coupling arrangements being spaced by 90° about the periphery of the probe head and having radio-frequency supply currents that are shifted by 90°.

13. Probe head according to claim 12, wherein said coupling arrangements are fed from a common radio-frequency current source, the supply line for one coupling arrangement being longer, electrically, by 90° than the supply lines of the other coupling arrangement.

14. A probe head for nuclear magnetic resonance (NMR) measurements, in particular for use in NMR tomography, comprising a hollow cylindrical housing having an outer cylindrical wall, an inner cylindrical wall, end faces there between at axial ends of said cylindrical walls, and at least one tubular electrically conductive section arranged to slide in the axial direction inside said inner wall, said outer cylindrical wall comprising a substantially uniform and electrically conductive material, said inner cylindrical wall surrounding a sample area and being provided with a plurality of axially extending electric conductors, said conductors being equidistantly arranged in a parallel relationship with respect to each other over the circumference of a tubular carrier body of dielectric material, said end faces being conductive to alternating current and conductively connected to said outer cylindrical wall, coupling means being provided for generating electric radio-frequency currents in said conductors.

15. Probe head according to claim 14, wherein two sections are arranged in the inner wall in the area of said end faces.

* * * * *